(12) United States Patent
Uchida et al.

(10) Patent No.: US 9,352,548 B2
(45) Date of Patent: May 31, 2016

(54) PASTE SUPPLY APPARATUS AND SCREEN PRINTING MACHINE

(71) Applicant: PANASONIC INTELLECTUAL PROPERTY MANAGEMENT CO., LTD., Osaka (JP)

(72) Inventors: Hideki Uchida, Yamanashi (JP); Masaaki Tokunaga, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/638,216

(22) Filed: Mar. 4, 2015

(65) Prior Publication Data

US 2015/0258775 A1    Sep. 17, 2015

(30) Foreign Application Priority Data

Mar. 17, 2014    (JP) .................................. 2014-053061

(51) Int. Cl.
| | |
|---|---|
| B41F 15/42 | (2006.01) |
| H05K 3/34 | (2006.01) |
| B41F 31/02 | (2006.01) |
| B41F 15/08 | (2006.01) |
| B41F 15/36 | (2006.01) |

(52) U.S. Cl.
CPC ............. *B41F 15/42* (2013.01); *B41F 15/0881* (2013.01); *B41F 15/36* (2013.01); *B41F 31/02* (2013.01); *H05K 3/3484* (2013.01); *B41P 2215/50* (2013.01)

(58) Field of Classification Search
CPC .......... B41F 15/40; B41F 15/42; B41F 15/44; B41F 15/0813; B41F 31/02; H05K 3/1233; H05K 3/3484
USPC ........................................... 101/123; 222/342
See application file for complete search history.

(56) References Cited

U.S. PATENT DOCUMENTS

| | | | | |
|---|---|---|---|---|
| 3,153,815 | A | * | 10/1964 | Seidl .............................. 425/449 |
| 4,808,435 | A | * | 2/1989 | Cropp et al. .................. 427/97.8 |
| 2004/0244612 | A1 | * | 12/2004 | Willshere ....................... 101/123 |
| 2009/0294483 | A1 | * | 12/2009 | Kim ............................ 222/386 |

FOREIGN PATENT DOCUMENTS

| | | | | |
|---|---|---|---|---|
| JP | 08-20743 | * | 8/1996 | .............. B41F 15/40 |
| JP | 2010-172928 A | | 8/2010 | |

\* cited by examiner

*Primary Examiner* — Jill Culler
*Assistant Examiner* — Marissa Ferguson Samreth
(74) *Attorney, Agent, or Firm* — Pearne & Gordon LLP

(57) ABSTRACT

A paste supply apparatus includes: a pot holder which holds a paste pot including an inner lid movable in a container; an ejecting member; an elastic member provided at the ejecting member and including an annular pad portion including a taper having a diameter increasing toward downward; an annular protruding portion protruding downward from a lower surface of the ejecting member within an internal space surrounded by the pad portion; and an ejecting member lifting unit which moves the ejecting member to press down the inner lid to eject the paste. When the ejecting member presses down the inner lid, the pad portion of the elastic member is elastically deformed to extend outside and firmly contacts an upper surface of the inner lid, and the annular protruding portion abuts on the upper surface of the inner lid within the internal space.

4 Claims, 8 Drawing Sheets

PASTE SUPPLY APPARATUS AND SCREEN PRINTING MACHINE

BACKGROUND

1. Technical Field

One or more embodiments of the present invention relate to a paste supply apparatus which ejects and supply paste on a mask from a paste pot, and a screen printing machine including the paste supply apparatus.

2. Background Art

JP-A-2010-172928 describes a paste supply apparatus which supplies paste on a mask for a screen printing. The paste supply apparatus ejects and supplies the paste directly from a commercially-available paste pot which stores the paste in a tubular container. In the paste supply apparatus, the paste pot is held such that a through hole formed in a bottom portion of the container faces downward, and the paste is directly ejected by using an ejecting member. In the above-described type of the paste supply apparatus which directly ejects the paste by the ejecting member, attachment of the ejecting member so as to firmly contact an inner wall of the container requires time and effort. Therefore, there is another type of the paste supply apparatus which causes the ejecting member to press down an inner lid.

In this type, it is necessary to apply pressure evenly to the inner lid entirely. Consequently, a paste supply apparatus provided with an elastic member attached to the ejecting member is proposed. With this configuration, a region in the vicinity of an outer periphery of the inner lid is pressed down by the elastic member.

SUMMARY

However, in the paste supply apparatus which presses down an upper surface of the inner lid by the elastic member, the elastic member is easily deformed. Consequently, it is difficult to press straight down the inner lid in a stable posture, and the paste may remain in an inner side surface of the container, whereby waste paste is likely to be generated.

An object of one or more embodiments of the the present invention is to provide a paste supply apparatus and a screen printing machine which can suppress paste from remaining on an inner side surface of a container paste of a paste pot and reduce waste paste.

In one or more embodiments of the present invention, there is provided a paste supply apparatus including: a pot holder which holds a paste pot including a tubular container which stores paste and which includes a bottom portion having a through hole and an inner lid movable in the container, such that the through hole of the paste pot faces downward; an ejecting member having a diameter smaller than an inner diameter of the container; an elastic member which is provided at the ejecting member and which includes an annular pad portion including a taper having a diameter increasing toward downward; an annular protruding portion provided to protrude downward from a lower surface of the ejecting member within an internal space surrounded by the pad portion; and an ejecting member lifting unit which moves up and down the ejecting member, and which causes the ejecting member to press down the inner lid of the paste pot held by the pot holder to eject the paste from the through hole, wherein when the ejecting member presses down the inner lid, the pad portion of the elastic member is elastically deformed to extend outside and firmly contacts an upper surface of the inner lid, and the annular protruding portion abuts on the upper surface of the inner lid within the internal space of the pad portion.

In one or more embodiments of the present invention, there is provided a screen printing machine including: a mask; a paste supply apparatus which supplies paste on the mask by using a paste pot including a tubular container which stores the paste and which includes a bottom portion having a through hole and an inner lid movable in the container; a squeegee slidable on the mask on which the paste is supplied by the paste supply apparatus, wherein the paste supply apparatus includes: a pot holder which holds the paste pot such that the though hole faces downward; an ejecting member having a diameter smaller than an inner diameter of the container; an elastic member which is provided at the ejecting member and which includes an annular pad portion including a taper having a diameter increasing toward downward; an annular protruding portion provided to protrude downward from a lower surface of the ejecting member within an internal space surrounded by the pad portion; and an ejecting member lifting unit which moves up and down the ejecting member, and which causes the ejecting member to press down the inner lid of the paste pot held by the pot holder to eject the paste from the through hole, and wherein when the ejecting member presses down the inner lid, the pad portion of the elastic member is elastically deformed to extend outside and firmly contacts an upper surface of the inner lid, and the annular protruding portion abuts on the upper surface of the inner lid within the internal space of the pad portion.

According to one or more embodiments of the present invention, it is possible to suppress paste from remaining on an inner side surface of a container paste of a paste pot and to reduce waste paste.

DETAILED DESCRIPTION

Figure 1:
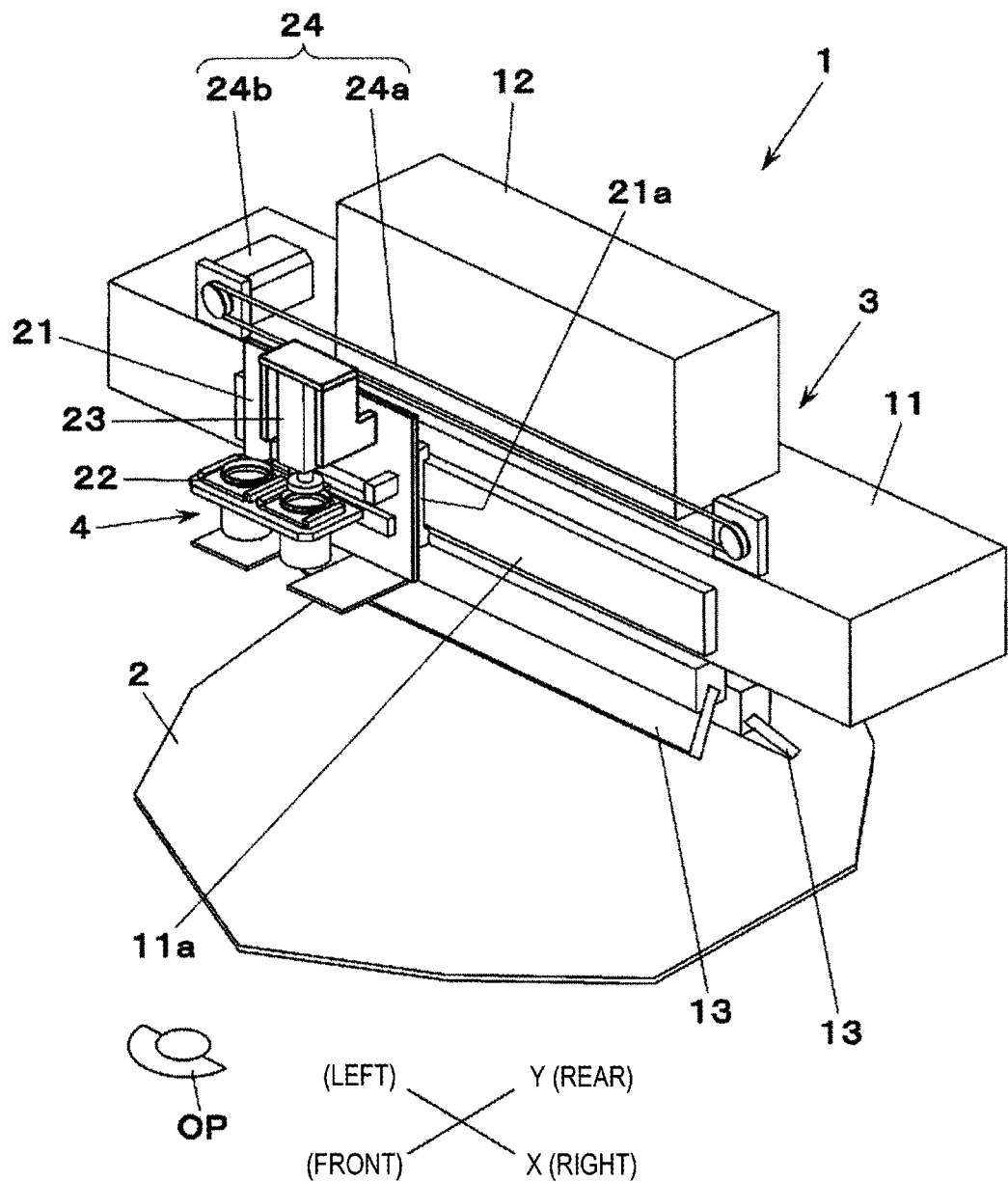
FIG. 1 is a perspective view of a screen printing machine according to an embodiment of the present invention.

One or more embodiments of the present invention will be described with reference to the drawings. FIG. 1 shows a screen printing machine 1 which is a machine for screen-printing paste such as solder paste on a board (not shown) and which includes a mask 2 having pattern holes corresponding to positions of electrodes of the board, a print head 3 provided above the mask 2, and a paste supply apparatus 4 provided in the print head 3.

As shown in FIG. 1, the print head 3 includes: a movable base 11 which is moved in a front-rear direction viewed from an operator OP (hereinafter also referred to as a Y-axis direction) by a head moving mechanism (not shown); a squeegee lifting mechanism 12 provided on an upper surface of the movable base 11; two squeegees 13 which are provided below the movable base 11 and individually moved up and down by the squeegee lifting mechanism 12. The squeegees 13 extend in a right-left direction viewed from the operator OP (hereinafter also referred to as an X-axis direction, and oppose each other in the Y-axis direction.

Figure 2:
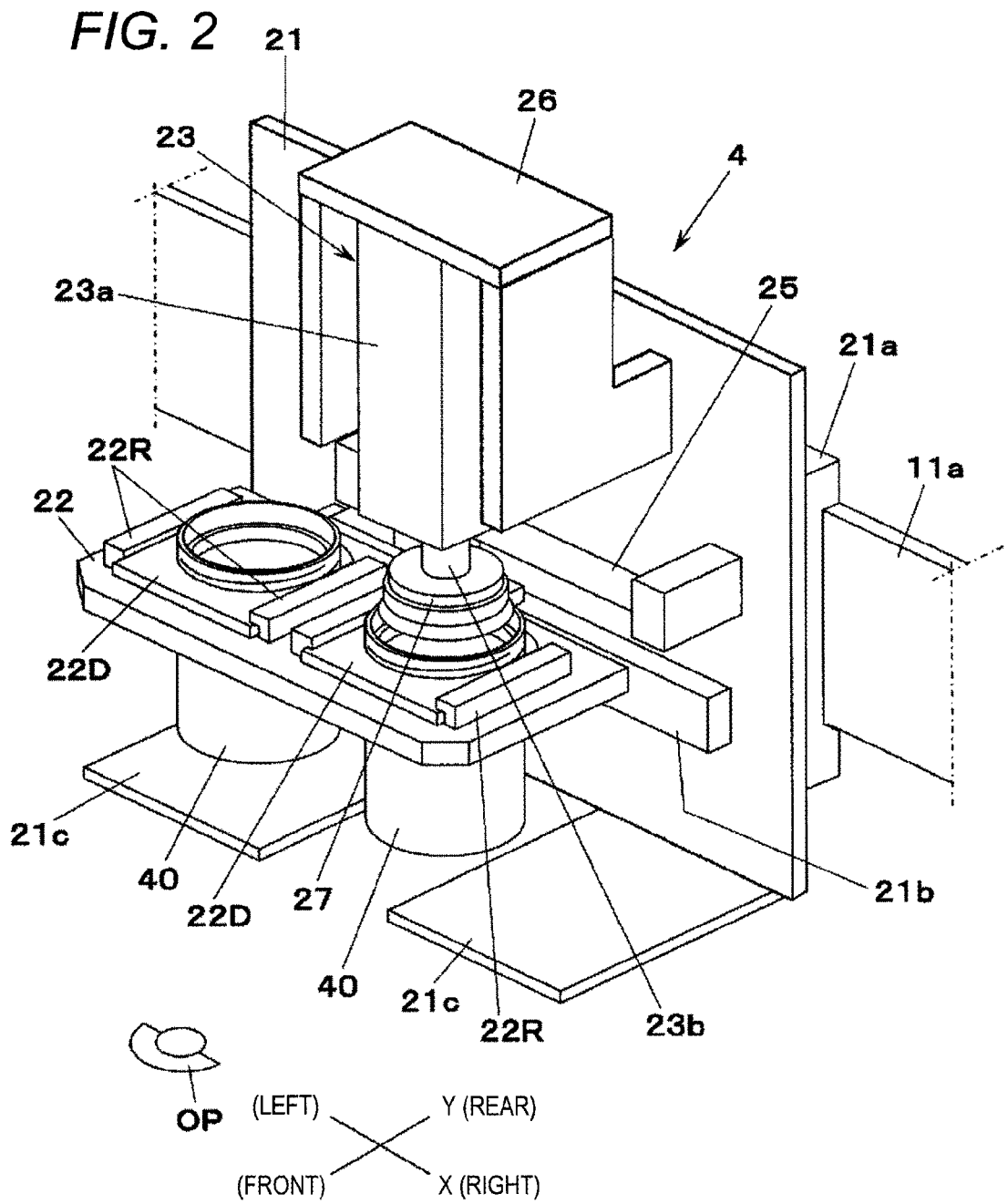
FIG. 2 is a perspective view of a paste supply apparatus provided in the screen printing machine according to the embodiment of the present invention.

As shown in FIGS. 1 and 2, the paste supply apparatus 4 includes: a base member 21; a pot holder 22 provided on a front surface (opposing the operator OP) of the base member 21; and a pressing cylinder 23 provided on the front surface of the base member 21. On a front surface of the movable base 11, a first guide 11a is provided to extend in the X-axis direction. A first slider 21a is provided on a rear surface side of the base member 21, and is slidably attached to the first guide 11a.

As shown in FIG. 1, a belt driving mechanism 24 is provided on the movable base 11, and includes a timing belt 24a spanned to extend in the X-axis direction; and a motor 24b which drives the timing belt 24a. The rear surface of the base member 21 is coupled to the timing belt 24a. When the motor 24b drives the timing belt 24a, the base member 21 (i.e., the paste supply apparatus 4) moves along the X-axis direction in front of the movable base 11.

Figure 3:
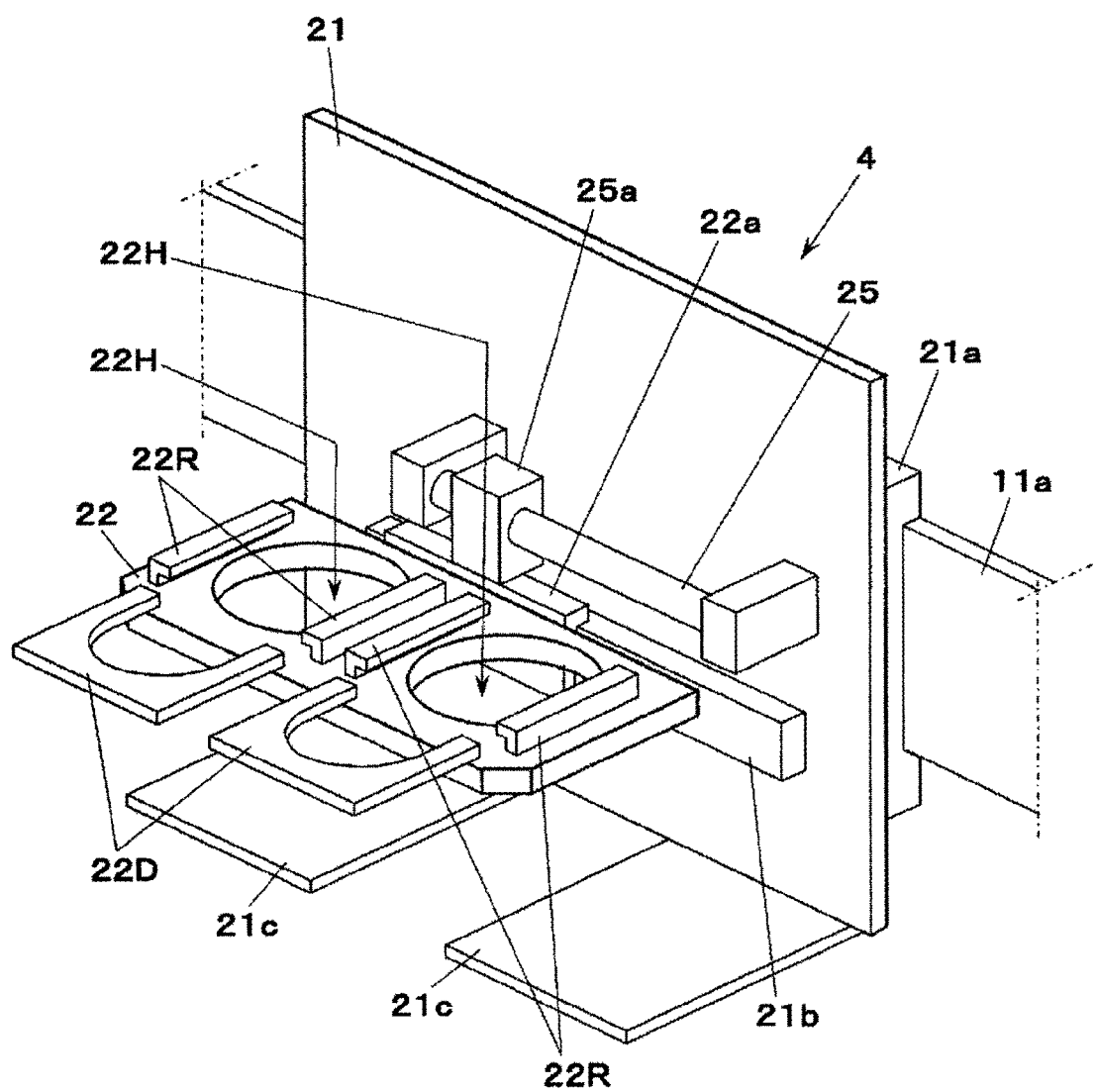
FIG. 3 is a perspective view of the paste supply apparatus according to the embodiment of the present invention.

As shown in FIG. 3, the pot holder 22 is formed of a plate member provided to extend in a horizontal direction, and includes two pot insertion holes 22H arranged in the X-axis direction. Each of the pot insertion holes 22H allows a paste pot 40 to be inserted therein (FIG. 2).

As shown in FIG. 3, on the front surface of the base member 21, a second guide 21b is provided to extend in the X-axis direction. A second slider 22a is provided on a rear surface side of the pot holder 22, and is slidably attached to the second guide 21b. On the base member 21 and above the second guide 21b, a rod-less cylinder 25 is provided to move a moving body 25a along the X-axis direction. The second slider 22a is coupled to the moving body 25a. When the rod-less cylinder 25 moves the moving body 25a along the X-axis direction, the pot holder 22 moves along the X-axis direction in front of the base member 21.

As shown in FIG. 2, on an upper region of the front surface of the base member 21, a bracket 26 is provided. A cylinder tube 23a of the pressing cylinder 23 is attached to the bracket 26. The pressing cylinder 23 is provided such that a piston rod 23b faces downward, and an ejecting member 27a is attached to a lower end of the piston rod 23b. The ejecting member has a disk shape (or cylindrical shape) of a diameter smaller than an inner diameter of a container 41 of the the paste pot 40.

Figure 4A:
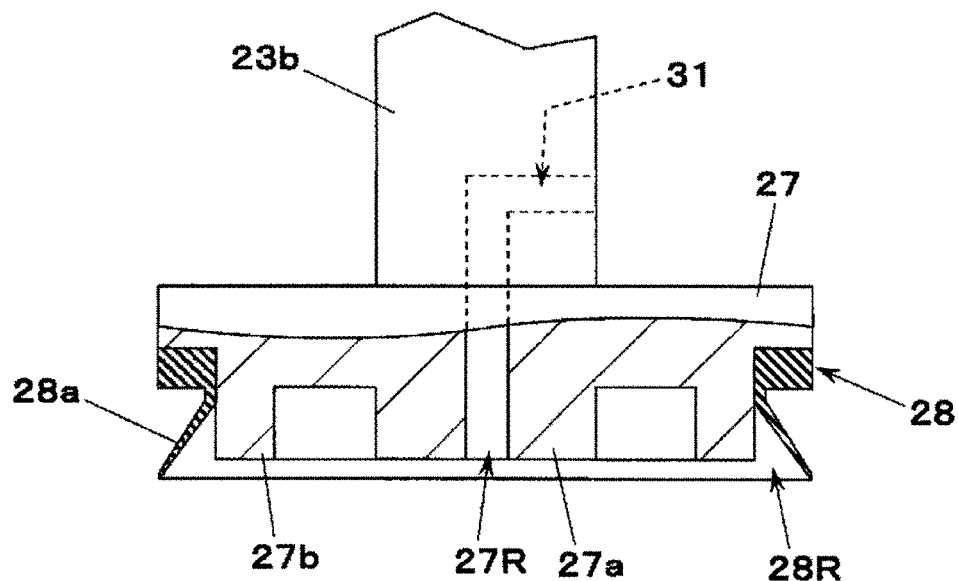
FIGS. 4A and 4B are partial cross-sectional side views of an ejecting member and an elastic member attached to the ejection member provided in the paste supply apparatus according to the embodiment of the present invention.
Figure 4B:
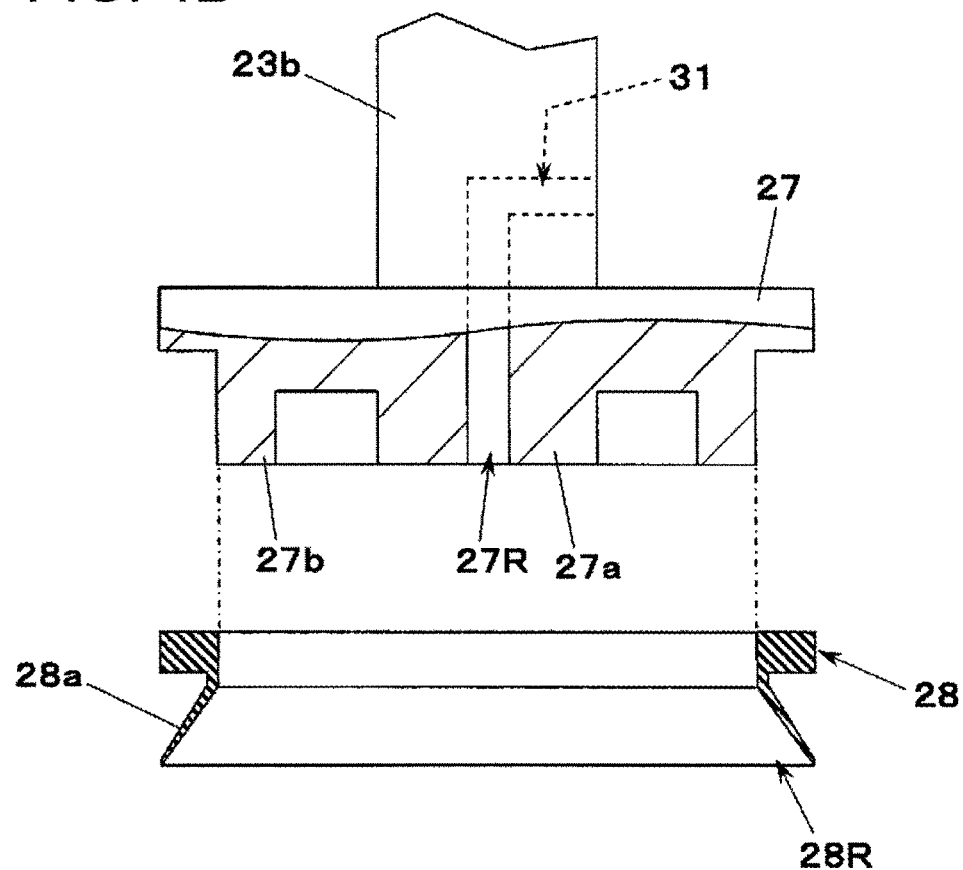

As shown in FIGS. 4A and 4B, the ejecting member 27 includes: a cylindrical protruding portion 27a formed to protrude downward from a center portion of a lower surface of the ejecting member 27; and an annular protruding portion 27b formed to protrude downward so as to surround the cylindrical protruding portion 27a. An elastic member 28 is fitted to an outer peripheral surface of the annular protruding portion 27b, and includes an annular pad portion 28a provided with a taper having a diameter increasing toward downward. The annular protruding portion 27b protrudes and extends downward within an internal space surrounded by the pad portion 28a (hereinafter referred to as an internal space 28R). A lower surface of the cylindrical protruding portion 27a is positioned equal to or slightly higher than a lower surface of the annular protruding portion 27b in an up-down direction, and a lower end of the pad portion 28a of the elastic member 28 is lower than the lower surface of the cylindrical protruding portion 27a and the lower surface of the annular protruding portion 27b in the up-down direction in a state in which the pad portion 28a is not elastically deformed. As used herein, the term "annular" means a shape which surrounds something, and may include a circular ring shape or a hollow polygonal shape. The annular protruding portion 27b may be formed by an annular member attached to the lower surface of the ejecting member 27.

Figure 5:
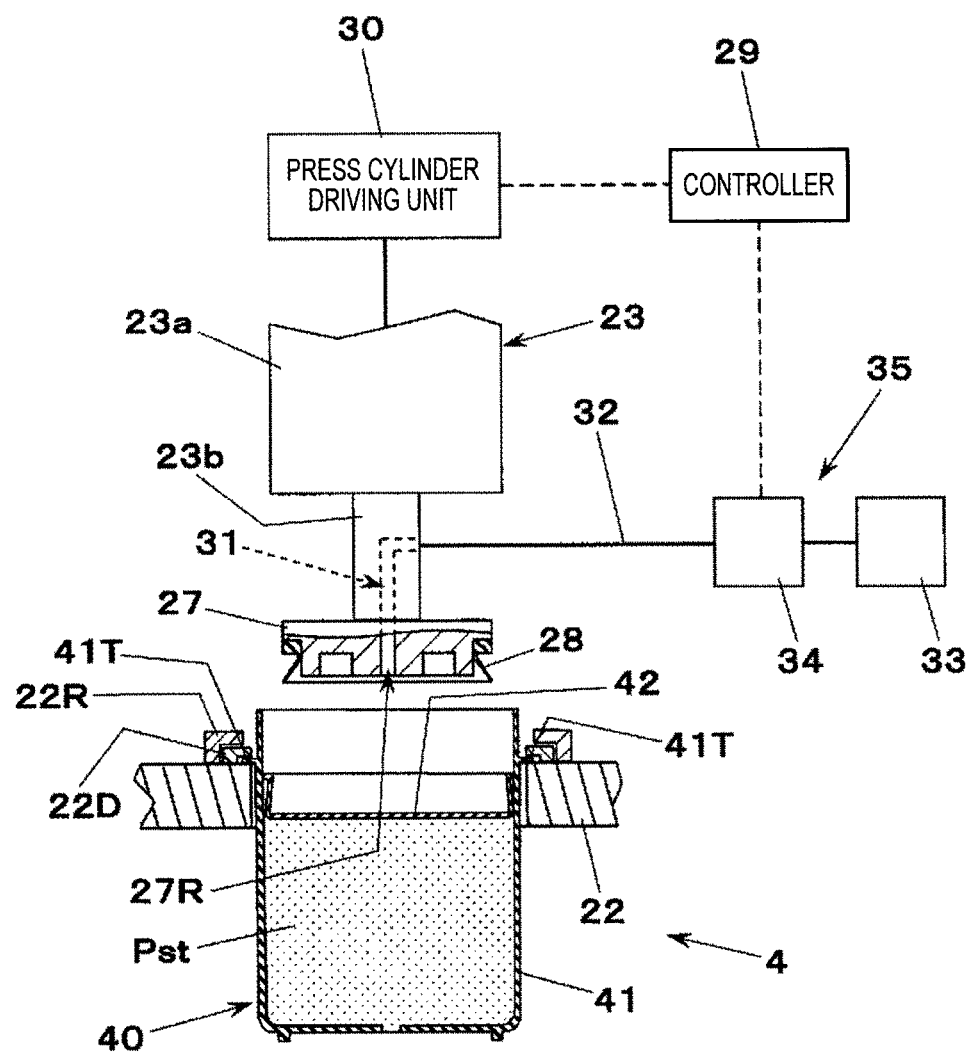
FIG. 5 is a diagram showing a control system of the paste supply apparatus according to the embodiment of the present invention.

As shown in FIG. 5, the screen printing machine 1 includes a controller 29 which controls a pressing cylinder driving unit 30. The pressing cylinder 23 is driven by the pressing cylinder driving unit 30 to pull and push the piston rod 23b, whereby the ejecting member 27 moves up and down. In other words, the pressing cylinder 23 serves as an example of an ejecting member lifting unit which moves up and down the ejecting member 27.

As shown in FIG. 5, in an inside of the ejecting member 27 and the piston rod 23b, a suction path 31 is formed. The suction path 31 connects an opening portion 27R opened at the lower surface of the cylindrical protruding portion 27a (FIGS. 4A and 4B) with a negative pressure generator 33 via a pipe 32 extending in an outside of the piston rod 23b, and a valve 34 is interposed into the pipe 32. When the valve 34 is operated by the controller 29 in a state in which the negative pressure generator 33 generates negative pressure, vacuum pressure is supplied to the opening portion 27R via the pipe 32 and the suction path 31, and suction power is generated at the lower surface of the cylindrical protruding portion 27a. In other words, the suction path 31, the pipe 32, the negative pressure generator 33, and the valve 34 form a suction power generating mechanism 35 which generates the suction power at the lower surface of the cylindrical protruding portion 27a.

Figure 6A:
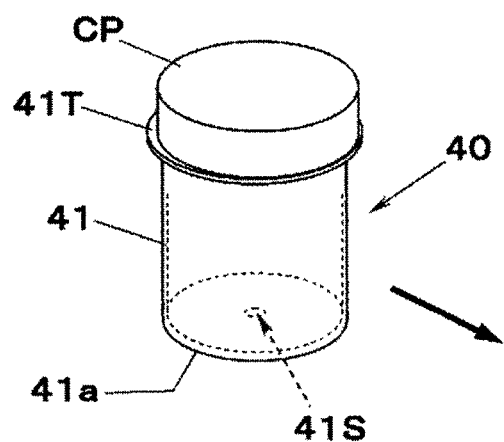
FIGS. 6A to 6C are partial cross-sectional views of a paste pot used for the paste supply apparatus according to the embodiment of the present invention.
Figure 6B:
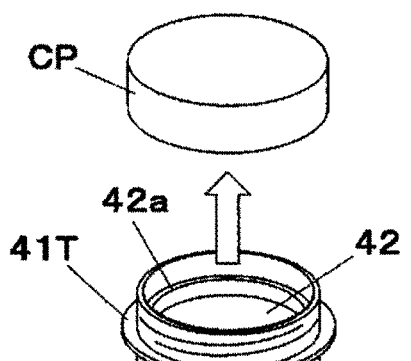
Figure 6C:
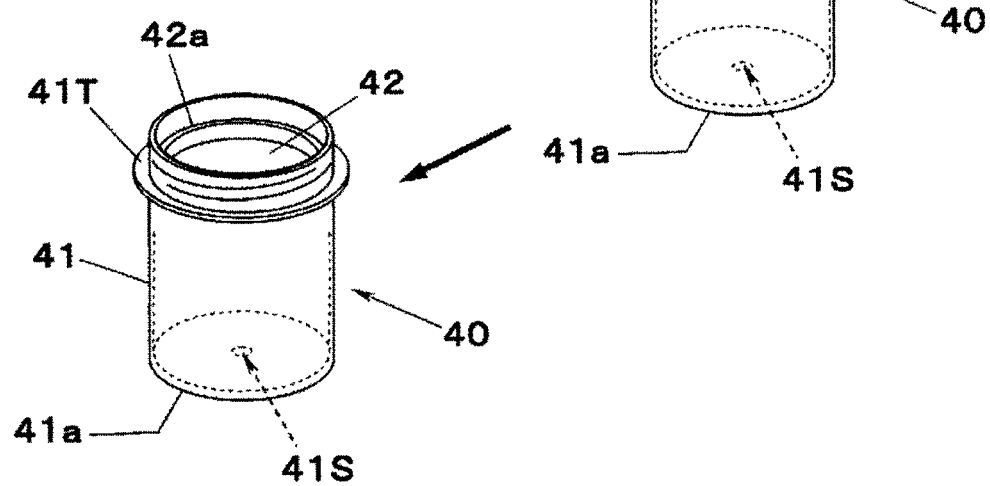

As shown in FIG. 6A to 6C, the paste pot 40 includes: the tubular container 41 which stores the paste Pst; and an inner lid 42 provided in the container 41, and a bottom portion 41a of the container 41 has a through hole 41S formed therein. An outer edge of the inner lid 42 is bent upward to form a bent portion 42a, and the bent portion 42a firmly contacts an inner wall of the container 41. The inner lid 42 is movable in the container 41 in the up-down direction. The paste pot 40 is placed to the pot holder 22 by removing a cap CP attached to an open end of the container 41 (from FIG. 6A to FIG. 6B), and thereafter setting a posture of the paste pot 40 such that the the the through hole 41S faces downward (FIG. 6C), and inserting the paste pot into the pot insertion hole 22H such that a flange portion 41T provided on a side surface of the container 41 abuts on an edge portion the pot insertion hole 22H from above.

As shown in FIGS. 2 and 3, each of the pot insertion holes 22H are sandwiched between a pair fixture holding members 22R from outside in the X-axis direction. When a pot fixture 22D is inserted, from front, the pair of fixture holding members 22R attached at positions sandwiching each of the pot insertion holes 22H, the flange portion 41T of the paste pot 40 abutting on the edge portion of the pot insertion hole 22H is held by the pot fixture 22D from above, and the paste pot 40 is held by the pot holder 22 in a state in which the movement in the up-down direction is regulated.

The positions of the two paste pots 40 held by the two pot insertion holes 22H are switched by a position switching operation of the moving body 25a of the rod-less cylinder 25, such that one of the paste pots 40 is positioned immediately below the pressing cylinder 23 (i.e., positioned at a paste supply position), and the other thereof is positioned at a position different from (right or left of) the paste supply position (i.e., positioned at a standby position). As shown in FIGS. 2 and 3, in the left and right regions on a lower portion of the base member 21, a plate-shaped paste catch 21c is provided so as to receive the paste Pst dropping from the through hole 41S of the paste pot 40 positioned at the standby position.

Figure 7A:
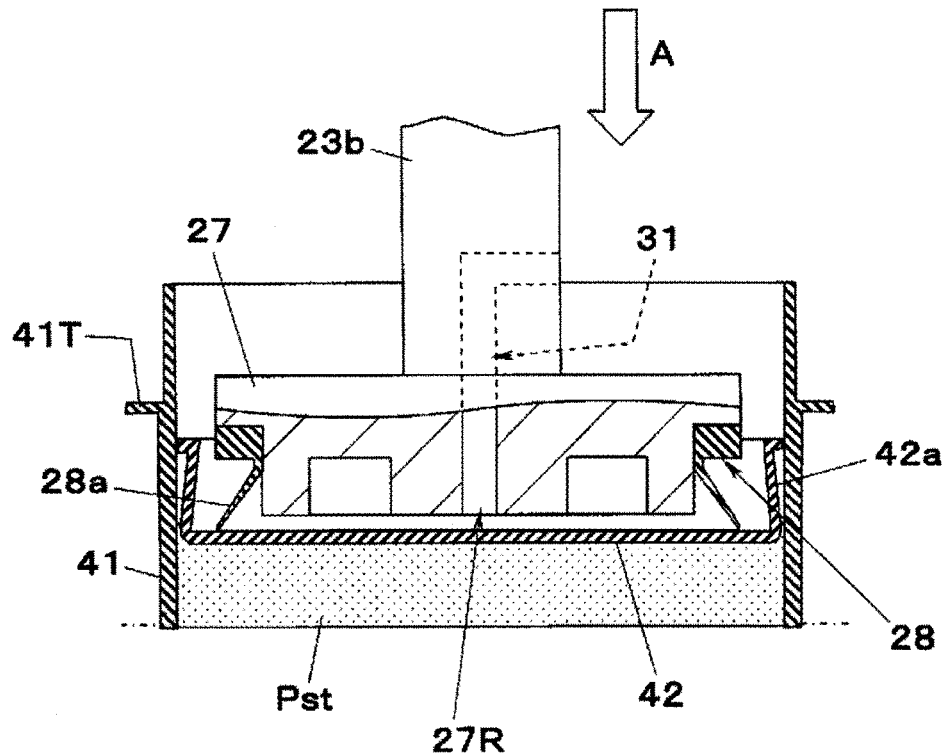
FIGS. 7A and 7B are partial cross-sectional views of the paste supply apparatus according to the embodiment of the present invention.
Figure 7B:
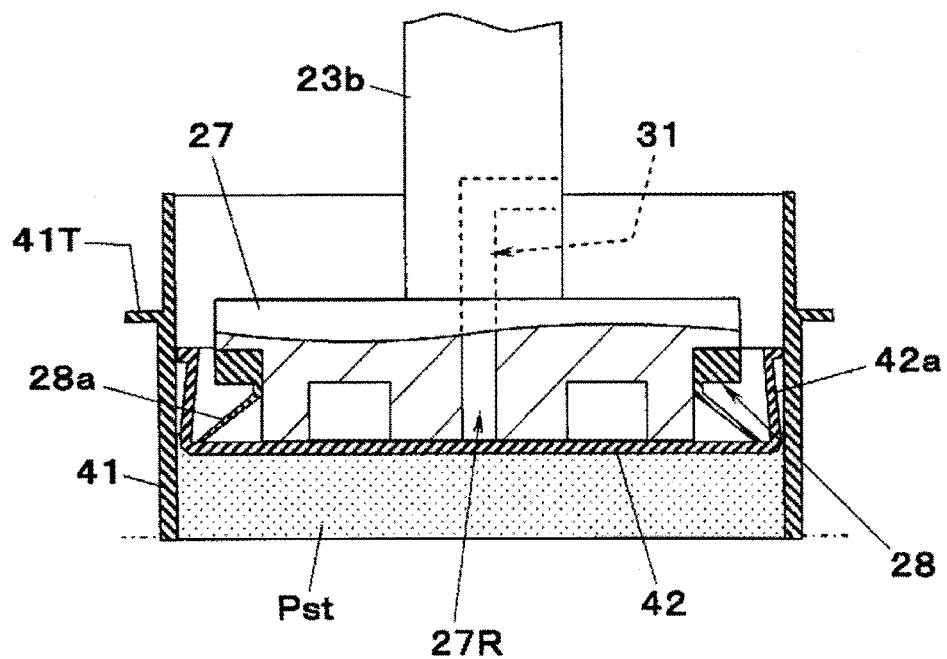

Supply of the paste Pst of the paste supply apparatus 4 is performed by controlling the pressing cylinder 23 and the suction power generating mechanism 35 by the controller 29. When the controller 29 outputs a paste ejection command signal, the pressing cylinder 23 starts pushing operation of the piston rod 23b to move down the ejecting member 27. The pushing operation continues such that the pad portion 28a of the elastic member 28 of the lower surface of the ejecting member 27 abuts on an upper surface of the inner lid 42 of the paste pot 40 positioned at the paste supply position (FIG. 7A), and then the lower surface of the cylindrical protruding portion 27a and the lower surface of the annular protruding portion 27b abuts on the upper surface of the inner lid 42 while the pad portion 28a is deformed to extend outside an firmly contacts a region in the vicinity of an outer periphery of the upper surface of the inner lid 42 (FIG. 7B).

Figure 8A:
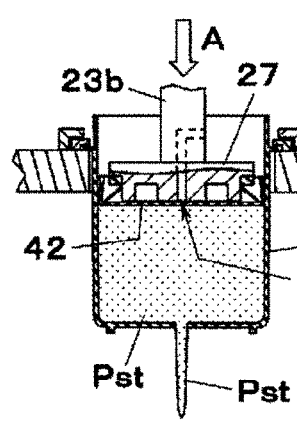
FIGS. 8A to 8C are operation diagrams of the paste supply apparatus according to the embodiment of the present invention.

After the cylindrical protruding portion 27a and the annular protruding portion 27b of the ejecting member 27 abut on the upper surface of the inner lid 42 while the pad portion 28a of the elastic member 28 firmly contacts the upper surface of the inner lid 42 as described above, the pressing cylinder 23 further presses down the inner lid 42 in the container 41 (FIG. 8A: an arrow A), thereby moving down the inner lid 42 in the container 41 and ejecting the paste Pst from the through hole 41S (FIG. 8A). In a state in which the ejecting member 27 abuts on the inner lid 42, the suction power generating mechanism 35 supplies the vacuum pressure in the opening portion 27R opened in the lower surface of the cylindrical protruding portion 27a so as to generate the suction power, whereby the inner lid 42 is sucked and held by the ejecting member 27. In this state, since the pad portion 28a of the elastic member 28 firmly contacts the upper surface of the inner lid 42, the suction power for sucking the inner lid 42 affects the inside of the internal space 28R of the pad portion 28a, and a large region in the upper surface of the inner lid 42 can be sucked.

Figure 8B:
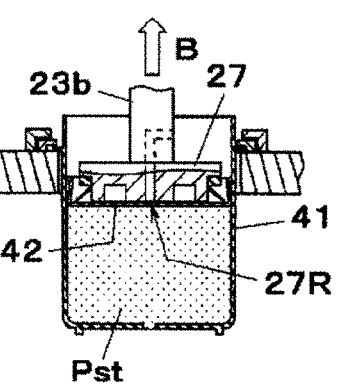
Figure 8C:
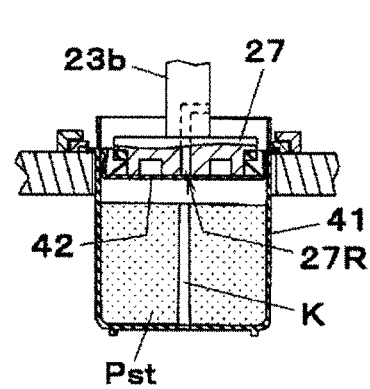

When a prescribed amount of the paste Pst is ejected by moving down the inner lid 42 by the pressing cylinder 23 by a predetermined length, the controller 29 stops outputting the paste ejection signal. Thereafter, the pressing cylinder 23 switches the operation of the piston rod 23b from the pushing operation to the pulling operation (FIG. 8B: an arrow B), and moves up the ejecting member 27 to lift the inner lid 42 by a predetermined length (FIG. 8B). By the lifting of the inner lid 42, the negative pressure is generated in the container 41, and the paste Pst in the vicinity of the through hole 41S is taken up into the container 41, whereby drop of the paste Pst from the through hole 41S is prevented. The lifting of the inner lid 42 preferably continues until, as shown in FIG. 8C, a tubular void portion K extending upward from the through hole 41S is formed by the sucked air from the through hole 41S.

As described above, when the ejecting member 27 presses down the inner lid 42, the pad portion 28a of the elastic member 28 is elastically deformed to extend outside and firmly contacts the upper surface of the inner lid 42, and the annular protruding portion 27b is maintained to abut on the upper surface of the inner lid 42 within the internal space 28R of the pad portion 28a. Therefore, the inner lid 42 moves down in the container 41 in a stable posture.

When the paste is screen-printed on the board the paste, at first, the paste supply apparatus 4 supplies the paste Pst on the mask 2 as described above. During the supply of the paste Pst on the mask 2, the controller 29 controls the belt driving mechanism 24 to cause the paste supply apparatus 4 to reciprocate along the X-axis direction (i.e., the direction in which the squeegee 13 extends). Consequently, the paste Pst is supplied to spread on the mask 2 in the direction in which the squeegee 13 extends.

After completion of the supply of the Pst on the mask 2, the controller 29 controls a board moving mechanism (not shown) such that the board moving mechanism to cause the board to contact (or to be placed close to) the lower surface of the mask 2. When the board contacts (or is placed close to) the mask 2, the squeegee lifting mechanism 12 moves down one of the squeegees 13 such that the lower end of the squeegee 13 abuts on the mask 2. Thereafter, the head moving mechanism (not shown) described above moves the print head 3 along the Y-axis direction such that the squeegee 13 slides on the mask 2, and the electrodes of the board is filled with the paste Pst via the pattern holes of the mask 2. After completion of the filling of the paste Pst, the board moving mechanism moves the board to be separate from the mask 2. Consequently, the screen printing for one sheet of the board is finished.

The paste Pst can be supplied on the mask 2 by the paste supply apparatus 4 until the container 41 becomes empty of the paste Pst. When the inner lid 42 reaches a bottom of the container 41 and the empty of the paste Pst in the paste pot 40 is detected, e.g., by an output from a stroke sensor (not shown) of the piston rod 23b, the controller 29 controls the suction power generating mechanism 35 to release the holding (suction) of the inner lid 42 by the ejecting member 27, and then the pressing cylinder 23 performs the pulling operation to move up the ejecting member 27. Consequently, the ejecting member 27 is pulled upward out from the container 41, whereby the operator OP can detach the container 41 from the pot insertion hole 22H and exchange the paste pot 40 for a new one. Since the inner lid 42 of the used paste pot 40 remains in the container 41, the operator OP can dispose of the container 41 together with the inner lid 42.

As described above, according to the paste supply apparatus 4 and the screen printing machine 1 of the present embodiment, when the ejecting member 27 presses down the inner lid 42, the pad portion 28a of the elastic member 28 is elastically deformed so as to extend outside and firmly contacts the upper surface of the inner lid 42, and the annular protruding portion 27b abuts on the upper surface of the inner lid 42 within the internal space 28R of the pad portion 28a, whereby the posture of the inner lid 42 can be stabled, and the inner lid 42 can be pressed straight down in the container 41. Consequently, the paste Pst hardly remains on the inner side surface of the container 41 of the paste pot 40, and waste of the paste Pst can be reduced.

According to one or more embodiments of the present invention, it is possible to provide a paste supply apparatus and a screen printing machine which can suppress paste from remaining on an inner side surface of a container paste of a paste pot and reduce waste paste.

What is claimed is:

1. A paste supply apparatus comprising:
   a pot holder which holds a paste pot comprising a tubular container which stores paste and which comprises a bottom portion having a through hole and an inner lid movable in the container, such that the through hole of the paste pot faces downward;
   an ejecting member having a diameter smaller than an inner diameter of the container;

an elastic member which is provided at the ejecting member and which comprises an annular pad portion comprising a taper having a diameter increasing toward downward;

an annular protruding portion provided to protrude downward from a lower surface of the ejecting member within an internal space surrounded by the pad portion; and an ejecting member lifting unit which moves up and down the ejecting member, and which causes the ejecting member to press down the inner lid of the paste pot held by the pot holder to eject the paste from the through hole, wherein when the ejecting member presses down the inner lid, the pad portion of the elastic member is elastically deformed to extend outside and firmly contacts an upper surface of the inner lid, and the annular protruding portion abuts on the upper surface of the inner lid within the internal space of the pad portion.

2. A screen printing machine comprising:

a mask;

a paste supply apparatus which supplies paste on the mask by using a paste pot comprising a tubular container which stores the paste and which comprises a bottom portion having a through hole and an inner lid movable in the container;

a squeegee slidable on the mask on which the paste is supplied by the paste supply apparatus, wherein the paste supply apparatus comprises:
- a pot holder which holds the paste pot such that the though hole faces downward;
- an ejecting member having a diameter smaller than an inner diameter of the container;
- an elastic member which is provided at the ejecting member and which comprises an annular pad portion comprising a taper having a diameter increasing toward downward;
- an annular protruding portion provided to protrude downward from a lower surface of the ejecting member within an internal space surrounded by the pad portion; and
- an ejecting member lifting unit which moves up and down the ejecting member, and which causes the ejecting member to press down the inner lid of the paste pot held by the pot holder to eject the paste from the through hole, and wherein when the ejecting member presses down the inner lid, the pad portion of the elastic member is elastically deformed to extend outside and firmly contacts an upper surface of the inner lid, and the annular protruding portion abuts on the upper surface of the inner lid within the internal space of the pad portion.

3. The paste supply apparatus of claim 1, wherein the pad portion has a length such that the pad portion is in contact with the upper surface of the inner lid when the annular protruding portion of the ejecting member is not in contact with the upper surface of the inner lid.

4. The screen printing machine of claim 2, wherein the pad portion has a length such that the pad portion is in contact with the upper surface of the inner lid when the annular protruding portion of the ejecting member is not in contact with the upper surface of the inner lid.

* * * * *